United States Patent
He et al.

(10) Patent No.: US 6,597,742 B1
(45) Date of Patent: *Jul. 22, 2003

(54) IMPLEMENTING REDUCED-STATE VITERBI DETECTORS

(75) Inventors: Runsheng He, Norman, OK (US); Joao R. Cruz, Norman, OK (US)

(73) Assignee: Hitachi Ltd., Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 09/603,703

(22) Filed: Jun. 27, 2000

Related U.S. Application Data

(63) Continuation of application No. 08/956,309, filed on Oct. 22, 1997, now Pat. No. 6,081,562.

(51) Int. Cl.[7] .......................... H04L 5/12; H04L 23/02
(52) U.S. Cl. ..................... 375/262; 375/342; 714/795
(58) Field of Search .......................... 375/262–265, 375/285, 290, 296, 340, 341, 346, 348; 714/792, 794, 795, 796, 786

(56) References Cited

U.S. PATENT DOCUMENTS

| | | |
|---|---|---|
| 5,031,195 A | 7/1991 | Chevillat et al. |
| 5,291,499 A | 3/1994 | Behrens et al. |
| 5,537,444 A | 7/1996 | Nill et al. |
| 5,761,212 A | 6/1998 | Foland, Jr. et al. |

OTHER PUBLICATIONS

*Trellis Coding for Partial–Response Channels*, Jack K. Wolf and Gottfried Ungerboeck, IEEE Transactions, vol. Com.–34, No. 8, Aug. 1986, pp. 765–773.

*Coset Codes for Partial Response Channels; or, Coset Codes with Spectral Nulls*, G. David Forney, Jr., IEEE Transactions on Information Theory, vol. 35, No. 5, Sep. 1989, pp. 925–943.

*A Modified Trellis Coding Technique for Partial Response Channels*, Reinhold Haeb, IEEE Transactions on Communications, vol. 40, No. 3, Mar. 1992, pp. 513–520.

*Improved Coding Techniques for Precoded Partial–Response Channels*; Kjell J. Hole and Oyvind Ytrehus; IEEE Transactions on Information Theory, vol. 40, No. 2, Mar. 1994, pp. 482–493.

*Proceeding: Global Telecom Conference 1995*, Naoya Kobayashi, Wataru Sakurai and Seiichi Mita, Source pp. 564–570.

*Reduced–State Sequence Estimation with Set Partitioning and Decision Feedback*, M. Vedat Eyuboglu and Shahid U.H. Qureshi, IEEE Transactions on Communications, vol. 36, No. 1, Jan. 1988, pp. 13–20.

*Reduced–Complexity Viterbi Detector Architectures For Partial Response Signaling*, Gerhard Fettweis, Razmik Karabed, Paul H. Siegel and Hemant K. Thapar, pp. 559–563.

*Primary Examiner*—Jean Corrielus
(74) *Attorney, Agent, or Firm*—Haynes and Boone, LLP.

(57) ABSTRACT

A method of design and an implementation system for reduced-state Viterbi detectors for intersymbol interference channels are provided. The method uses a complement states grouping technique that comprises the steps of finding the state distances between complement states; forming the reduced-state trellis by grouping the complement states with state distance no less than the minimum free distance; and by keeping the complement states with state distance less than minimum free distance unchanged. The resultant reduced-state Viterbi detector has negligible performance loss compared to the full-state Viterbi detector while the complexity is reduced by a factor of about two.

13 Claims, 4 Drawing Sheets

| LENGTH OF ERROR EVENTS | | 1 | 2 | 3 | 4 | 5 | 6 | 7 | 8 | 9 | 10 | 11 | 12 | 13 |
|---|---|---|---|---|---|---|---|---|---|---|---|---|---|---|
| $p_e = 10^{-5}$ | VD | 12 | 2 | 99 | 1 | 0 | 0 | 0 | 0 | 0 | 0 | 0 | 0 | 0 |
| | RSVD | 13 | 1 | 70 | 3 | 2 | 1 | 0 | 0 | 0 | 0 | 0 | 0 | 0 |
| $p_e = 10^{-4}$ | VD | 235 | 15 | 719 | 33 | 15 | 10 | 0 | 4 | 0 | 0 | 0 | 0 | 1 |
| | RSVD | 185 | 10 | 582 | 35 | 14 | 11 | 2 | 0 | 0 | 0 | 0 | 0 | 0 |

IMPLEMENTING REDUCED-STATE VITERBI DETECTORS

This application is a continuation of Ser. No. 08/956,309, filed on Oct. 22, 1997 now U.S. Pat. No. 6,081,562, issued Jun. 27, 2000.

Background of the Invention

The present invention relates to a method and system for decoding intersymbol interference (ISI) channels for digital communication. More specifically, this invention relates to the use of a complement states grouping technique (CSGT) for reducing the number of states of a Viterbi detector (VD) for ISI channels.

In decoding an ISI channel, maximum likelihood sequence estimation (MLSE), implemented with a well-known Viterbi detector, has a significant performance gain compared to other detection techniques, such as a decision-feedback equalizer. However, the implementation complexity of MLSE is generally larger than other detection techniques, and the increase in complexity could present a challenge for low-power and high-speed implementation. It is therefore desirable to reduce the implementation complexity of the Viterbi detector at the expense of a reasonable, preferably negligible, performance loss compared to MLSE.

It is well known that the complexity of the Viterbi detector is directly related to the number of states. The number of states is determined by:

$$M^K \qquad \text{equation (1)}$$

where M is the size of the channel input signal set and K is the length of the overall channel impulse response or the channel memory.

A classical technique for reducing the number of states of the Viterbi detector is described by M. V. Eyuboglu and S. U. H. Qureshi in an article entitled "Reduced-State Sequence Estimation with Set Partitioning and Decision Feedback," *IEEE Transactions on Communications*, Vol. 36, No. 1, pp. 13–20, January 1989, incorporated herein by reference. In the reduced-state sequence estimation (RSSE) technique described in the above-referenced article, each superstate in a reduced-state (RS) trellis is formed by combining states of an original maximum likelihood (ML) trellis using Ungerboeck-like set partitioning principles set forth in G. Ungerboeck, "Channel Coding with Multilevel/Phase Signals," *IEEE Transactions on Information Theory*, Vol. IT-28, pp. 55–67, January 1982, incorporated herein by reference. In the case of binary transmission, this classical RSSE technique simply becomes a state-truncation technique, where each superstate in the RS trellis is formed by truncating the ML state vector to a suitable length K', wherein K'<K.

Although the aforementioned technique provides a good tradeoff between complexity and performance for many communication channels, there are numerous applications where the classical RSSE technique does not provide a satisfactory solution that reduces the complexity with a reasonable performance loss. For example, for an Extended Partial Response, Class 4, (EPR4) channel with binary input, which is commonly encountered in magnetic recording systems, the loss caused by the classical RSSE is intolerable. Therefore, what is needed is a reduced state technique which ensures negligible performance loss while reducing the complexity of the Viterbi detector.

SUMMARY OF THE INVENTION

The present invention, accordingly, provides a method and system for implementing reduced state Viterbi detectors for ISI channels while ensuring a negligible performance loss. In one embodiment, the method includes the steps of determining state distances for all pairs of complement states and forming superstates of a reduced-state trellis by grouping pairs of complement states whose state distance satisfies a predetermined criterion. In another embodiment, the method for producing a reduced state trellis for the discrete system comprises the steps of determining a state distance for each pair of a plurality of pairs of complement states, forming a superstate from a pair of complement states of the plurality of pairs of complement states when the state distance of the pair satisfies a predetermined criterion, and keeping each state of a second pair of the plurality of pairs of complement states when the state distance of the second pair does not satisfy the predetermined criterion. In yet another embodiment, the method comprises steps of determining a state distance for a pair of complement states of the discrete channel, forming a superstate of a reduced-state trellis by grouping the pair of complement states if the state distance of the pair of complement states satisfies a predetermined criterion, and keeping each state of the pair of complement states if the state distance for the pair of complement states does not satisfy the predetermined criterion.

In one embodiment, the system comprises a channel encoder for encoding a data string to produce an encoded data string; a discrete time channel coupled to the channel encoder for transferring the encoded data string; a reduced-state detector coupled to the discrete time channel, which utilizes the complement states grouping technique (CSGT) to reduce the number of states in the detector and decodes the discrete time channel output sequence to generate the encoded data string; and a channel decoder coupled to the reduced-state detector for recovering the user data string from the encoded data string.

An advantage achieved with the present invention is that it reduces the number of states of the Viterbi detector, therefore, reducing its complexity. In most of the channels, the number of states can be reduced by a factor of about two.

Another advantage achieved with the present invention is that it ensures a negligible performance loss compared to MLSE, which is not achievable with the classical RSSE technique for channels such as the EPR4 channel.

Another advantage achieved with the present invention is that it generally causes no extra error propagation, which is a common problem for other reduced state techniques.

DETAILED DESCRIPTION OF THE PREFERRED EMBODIMENT

Figure 1:
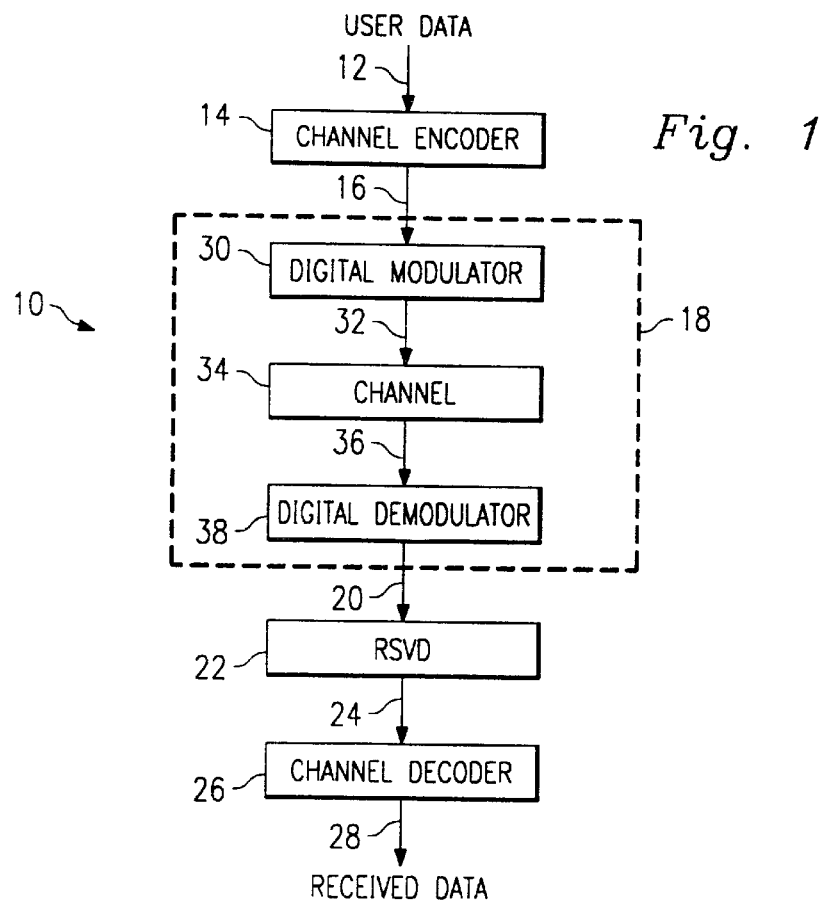
FIG. 1 is a functional schematic diagram of a digital communications channel according to the present invention.

Referring to FIG. 1, a digital communication system, generally designated 10, is illustrated for transmitting data from a user (not shown) to a receiver (not shown). The system 10 includes a line 12 for receiving input data (not shown) from the user and transferring the input data to a channel encoder 14, which could be an error-correcting code such as a Reed-Solomon code or a run-length-limited (RLL) code such as a (1,7),code. The channel encoder 14 outputs encoded data (not shown) onto a line 16 to an equivalent discrete channel 18. The equivalent discrete channel 18 receives the encoded data, carries the encoded data on a channel in a manner described below, and outputs demodulated data (not shown) onto a line 20 to a reduced-state Viterbi detector (RSVD) 22, which incorporates a complement state grouping technique (CSGT). As described in greater detail below, the RSVD 22 receives signals from the equivalent discrete channel 18 on the line 20, uses a recursive algorithm to give a maximum likelihood estimation of the input data on the line 16, outputs estimated data on a line 24 to a channel decoder 26. The channel decoder 26 performs an inverse operation of the channel encoder 14 and outputs a decoded data onto a line 28 to the receiver.

The equivalent discrete channel 18 includes a digital modulator 30 electrically connected for receiving the encoded data on the line 16 and for modulating the encoded data. The modulator 30 outputs a modulated data onto a line 32 to a channel medium 34, such as a satellite telecommunications link or a magnetic storage disk. The channel medium 34 is operative for outputting the modulated data onto a line 36 to a digital demodulator 38. The digital demodulator 38 is configured for demodulating the modulated data and outputting onto the line 20 the demodulated data to the RSVD 22.

In an embodiment of the present invention, the RSVD 22 is configured to decode the output of the discrete channel 18 with an EPR4 transfer function and binary inputs having a signal set of $\{-1, +1\}$. However, it is noted that the present invention can be applied to any discrete channel having finite impulse response, including those channels having transfer functions with non-integer coefficients. Furthermore, the channel input is not limited to the binary signal set; it could be a multi-level signal set.

Figure 2:
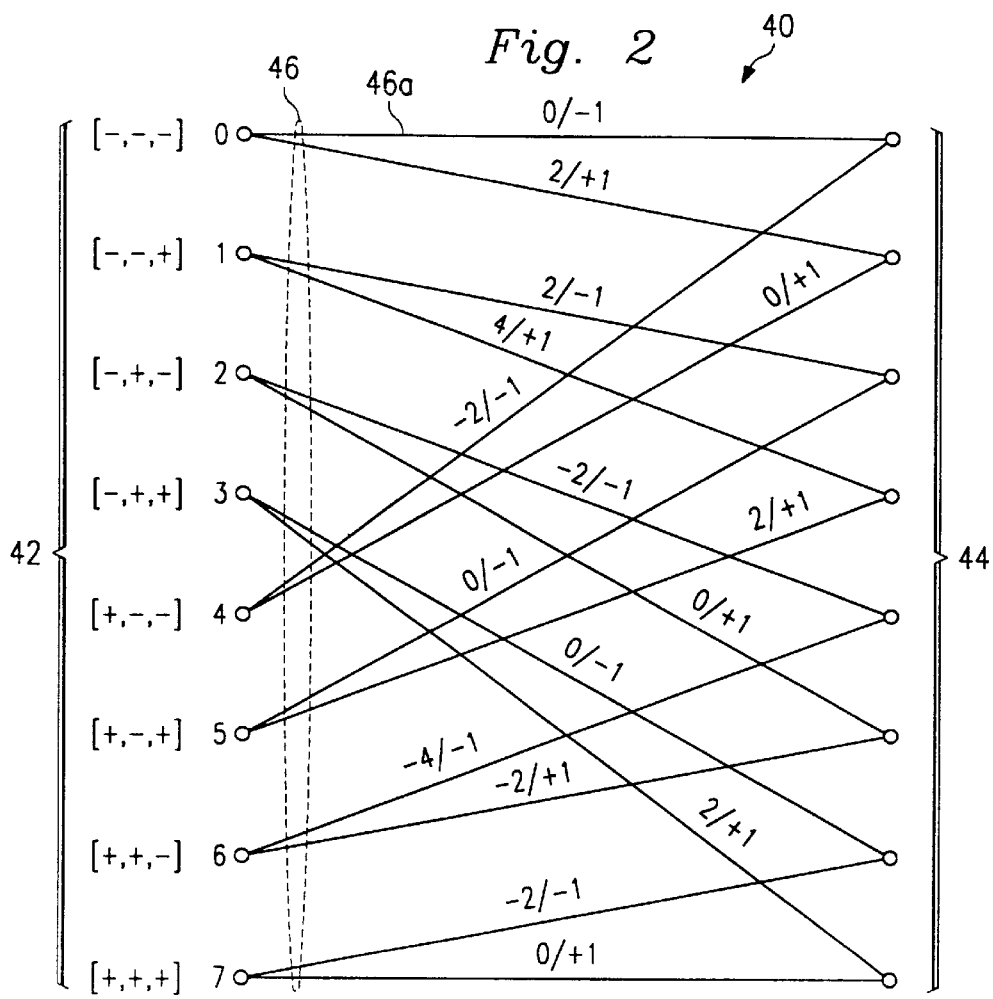
FIG. 2 is a maximum likelihood trellis associated with the Extended Partial Response, Class 4, (EPR4) channel.

In FIG. 2, one stage of a maximum likelihood (ML) trellis, generally designated 40, is shown for decoding the EPR4 channel. The ML trellis 40 is depicted in a manner well known to those skilled in the art. Nodes on the left, such as nodes 42, represent ML states (ML state is defined as a state in the ML trellis 40) at time k. Nodes on the right, such as nodes 44, represent the ML states at time k+1. Each ML state at time k is defined as:

$$[a_{k-K}, \ldots, a_{k-2}, a_{k-1}] \quad \text{equation (2)}$$

where $a_k$ represents a channel input at time k, $a_k \in \{-1, +1\}$ for binary transmission, and K is the length of the channel; K=3 for the EPR4 channel, which has a transfer function:

$$1+D-D^2-D^3. \quad \text{equation (3)}$$

There are eight ML states for the EPR4 channel as follows:
[−1, −1, −1]
[−1, −1, +1]
[−1, +1, −1]
[−1, +1, +1]
[+1, −1, −1]
[+1, −1, +1]
[+1, +1, −1]
[+1, +1, +1].

The eight ML states are numbered as 0, 1, 2, . . . , 7, respectively.

Each branch, such as one of the branches 46, represents a transition from a state at time k, represented by one of the nodes 42, to a state at time k+1, represented by one of the nodes 44. Each branch is labeled in a manner of $x_k/a_k$ or (channel output)/(channel input). For example, a branch 46a depicts a transition from state 0 at time k to state 0 at time k+1 with a channel input $a_k=-1$ and a channel output $x_k=0$. The Viterbi detector selects a path in the ML trellis 40 with a minimum "accumulated path metric" defined by:

$$\Sigma(y^k-x_k)^2 \quad \text{equation (4)}$$

where $y_k$ is the noisy channel output on the line 20, in FIG. 1, and $x_k$ is the noiseless channel output for a path at time k. The path selected in this way is a maximum likelihood estimate. The error probability of such estimation can be characterized by a minimum free distance, $d_{min}$, defined as a minimum Euclidean distance between any two paths in the ML trellis that diverge from a certain state and terminate at a certain state. For example, $d_{min}=4$ for the EPR4 channel.

Figure 3:
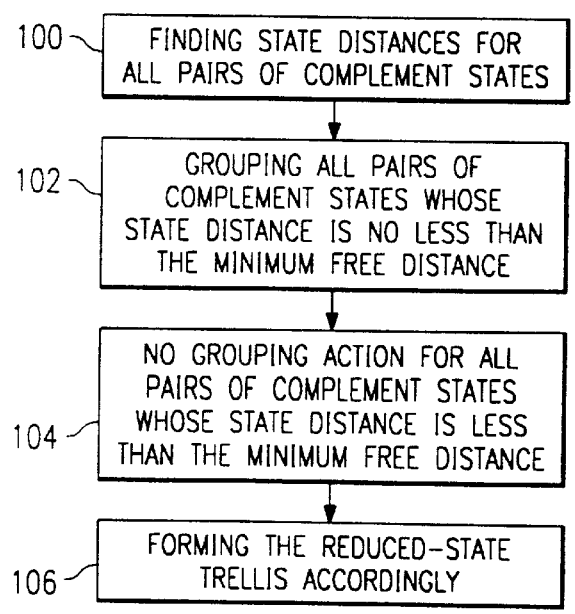
FIG. 3 is a flowchart of the method of complement states grouping technique (CSGT) used to design the reduced-state trellis.

In accordance with the present invention, FIG. 3 shows a flowchart of the method referred above as CSGT used to design a reduced-state trellis. Referring to step 100, a pair of complement states is defined as:

$$[a_{k-K}, \ldots, a_{k-2}, a_{k-1}] \quad \text{equation (5a)}$$

and $$[\bar{a}_{k-K}, \ldots \bar{a}_{k-2}, \bar{a}_{k-1}] \quad \text{equation (5b)}$$

where $\bar{a}_{k-i}$ is the complementary symbol of $a_{k-i}$, for example, $\bar{a}_{k-i}=-a_{k-i}$ when the channel input is a signal set $\{-1,+1\}$. If the channel input is a signal set $\{-3,-1,+1,+3\}$, the definitions are:

$$\overline{-3}=+1, \overline{+1}=-3, \overline{-1}=+3, \overline{+3}=-1. \quad \text{equation (6)}$$

At step 100 a state distance $D_{ij}$ is determined for every pair of complement states. The state distance $D_{ij}$ is a new term defined as a minimum Euclidean distance between any two paths in the ML trellis 40 which diverge from a common state such that one path terminates at state i while the other path terminates at state j. Step 100 can be carried out using a computer exhaustive search. For example, all the distances between complement states for the EPR4 channel with binary input are listed as follows:

$$D_{0,7}=4 \ D_{1,6}=4 \ D_{3,4}=\sqrt{24} D_{2,5}=\sqrt{8}. \quad \text{equation (7)}$$

At step 102, pairs of complement states are grouped into superstates in the reduced-state trellis if their state distance is no less than $d_{min}$, otherwise, no grouping action is taken at step 104. At step 106, the reduced-state trellis is created by using superstates and unpaired ML states as states in the RS trellis. The CSGT ensures a negligible performance loss compared to the Viterbi detector based on the ML trellis 40.

Figure 4:
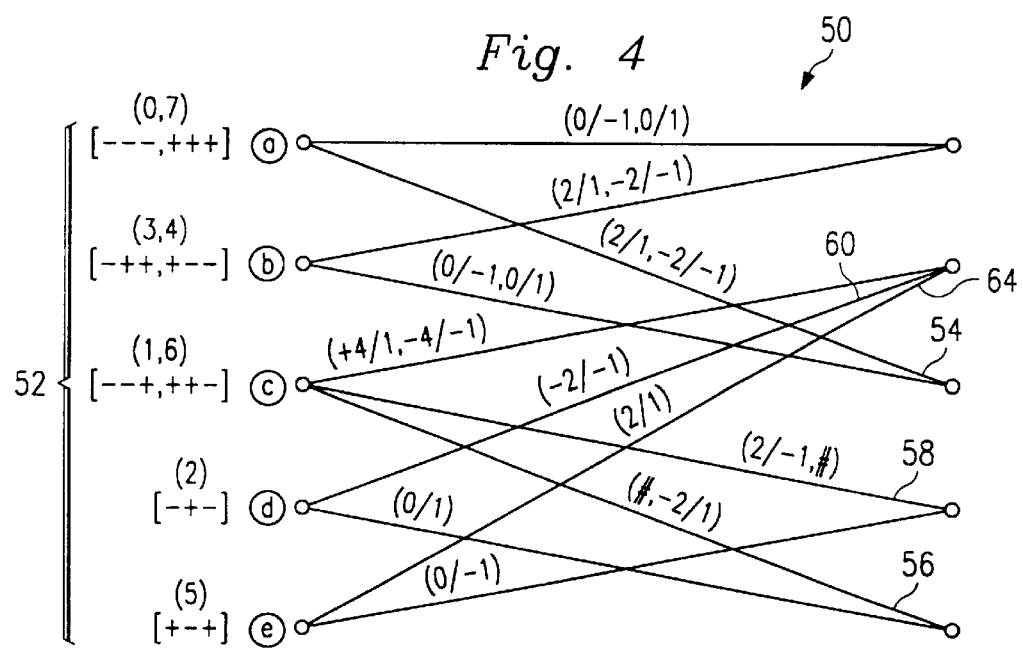
FIG. 4 is a reduced-state trellis for the EPR4 channel in accordance with the present invention.

Referring now to FIG. 4, in accordance with the present invention, a reduced-state trellis, generally designated 50, is obtained by using the CSGT for the EPR4 channel. The notation is similar to FIG. 2. Some nodes, such as a node 52 (superstate "a"), represent superstates in the reduced-state trellis 50. Some of the branches have a pair of possible branch values. For example, branch 54 has two possible branch values: 2/1 and −2/−1. To resolve this branch value ambiguity, feedback from a survivor path of each superstate is used. For example, when $a_{k-3}$ is −1 in the survivor path of superstate "a", the corresponding ML state for superstate "a" is determined to be [−1, −1, −1]. Accordingly, 2/1 is selected for branch 54 and the next stage ML state for superstate "c" is updated as [−1; −1, +1]. Similarly, when $a_{k-3}$ is +1 in the survivor path of superstate "a", the corresponding ML state is determined to be [+1, +1, +1]. Accordingly, −2/−1 is selected for branch 54 and the next stage ML state for superstate "c" is updated as [+1, +1, −1]. A branch label "#" for branches 56 and 58 denotes an invalid transition. For example, branch 56 is an invalid transition when $a_{k-3}$ is −1 in the survivor path of superstate "c". Similarly, branch 58 is an invalid transition when $a_{k-3}$ is +1 in the survivor path of superstate "c".

Figure 5:
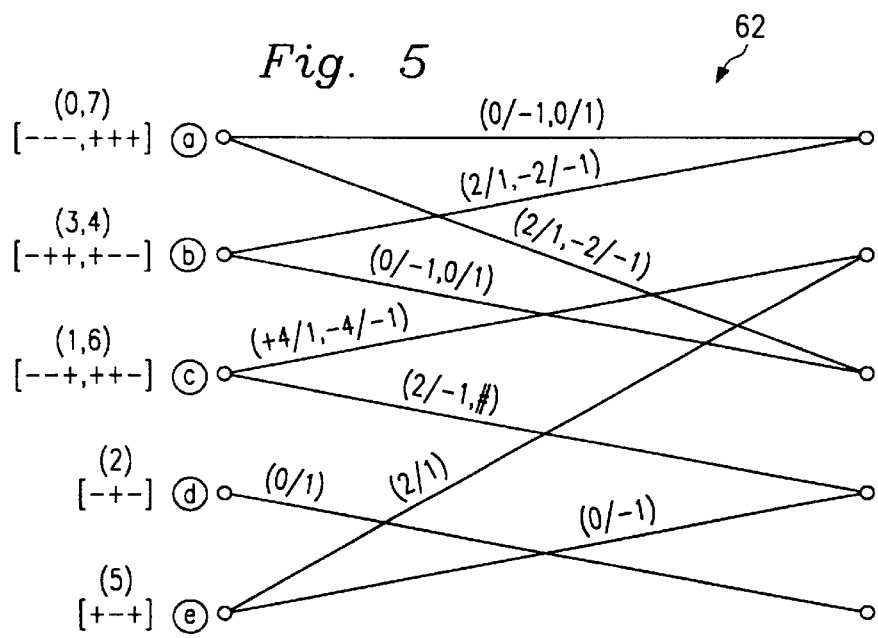
FIG. 5 is a modification of FIG. 4 when the channel output is greater than zero.
Figure 6:
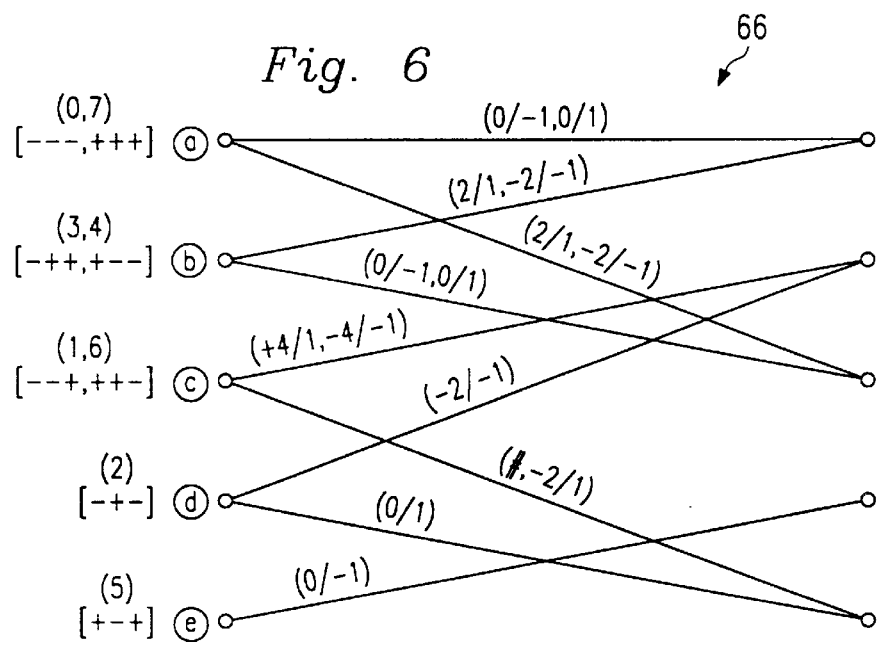
FIG. 6 is a modification of FIG. 4 when the channel output is less than zero.

FIG. 5 and FIG. 6 show the complexity of the trellis 50, FIG. 4, further simplified or reduced. When the channel output of a branch has an opposite sign from the noisy channel output on the line 20, then this branch is generally an unlikely branch and may be eliminated without performance loss. Accordingly, when ynoisy channel output on the line 20 in FIG. 1, is greater than zero, then the branch 56 and a branch 60 of the trellis 50, in FIG. 4, are eliminated and a corresponding simplified trellis 62 is shown in FIG. 5. Similarly, when $y_k$ is less than zero, then the branch 58 and a branch 64, FIG. 4, are eliminated and a corresponding simplified trellis 66 is shown in FIG. 6. While reducing the complexity of the trellis 50, this technique causes negligible performance loss in the EPR4 channel.

It is noted that the channel encoder 14 may impact both the ML trellis 40 and the reduced-state trellis 50. For example, the (1,7) RLL code will eliminate the channel state [−1, +1, −1] as well as [+1, −1, +1], whereas the rate 8/9 RLL code impacts neither the ML trellis 40 nor the reduced-state trellis 50.

Figures 7, 10:
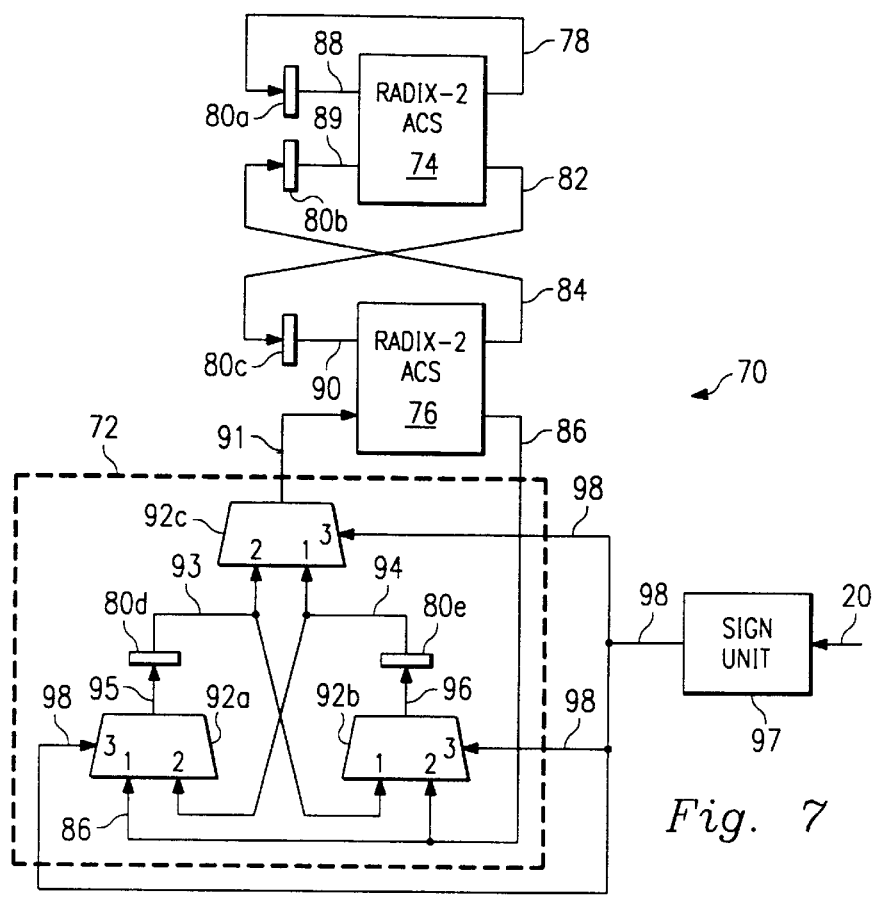
FIG. 7 is a schematic block diagram of a reduced-state Viterbi detector (RSVD) in accordance with the present invention.
FIG. 10 is a table showing simulation results which compare the error event histograms of the RSVD with that of the conventional Viterbi detector.

In FIG. 7, a reduced-state detector 70 implements the reduced-state trellis 50 using the sign of $y_k$ to reduce the complexity of the reduced-state trellis 50 implemented by a selection unit 72 as described in greater detail below. It is noted that the detector 70 is the circuit for implementing the path metric updating. The survivor path circuit (not shown) is the same as in the conventional Viterbi detector and receives data from the add-compare-select (ACS) units (not shown) and outputs data onto the line 24. The detector 70 includes two radix-2 ACS units 74 and 76 and the selection unit 72. Each of the radix-2 ACS units 74 and 76 is a combination of two 2-way ACS units. The radix-2 ACS units 74 and 76 are classical implementation units for the Viterbi algorithm. The radix-2 ACS units 74 and 76 differ from the conventional radix-2 ACS unit in that in the radix-2 ACS units 74 and 76 the survivor path of each state is used as feedback to select one of the branch values in the aforementioned manner.

An output from the radix-2 ACS unit 74 is inputted via a line 78 to a path metric register 80a. A second output from the radix-2 ACS unit 74 is inputted via a line 82 to a path metric register 80c. Similarly, one output from the radix-2 ACS unit 76 is inputted via a line 84 to a path metric register 80b. A second output from the radix-2 ACS unit 76 is inputted via a line 86 to the selection unit 72. Each path metric register is used to store the path metric. Specifically, path metric registers 80a, 80b, 80c, 80d and 80e are used to store the path metric of state a, b, c, d, e, respectively, of the trellis 50, FIG. 4. Each path metric register has a certain number of storage bits determined by the number of bits needed to represent the path metric. An output from the path metric register 80a is coupled to one input of the radix-2 ACS unit 74 via a line 88. An output from the path metric register 80b is coupled to a second input of the radix-2 ACS unit 74 via a line 89. Similarly, an output from the path metric register 80c is coupled to one input of the radix-2 ACS unit 76 via a line 90. An output from selection unit 72 is coupled to a second input of the radix-2 ACS unit 76 via a line 91. It should be noted that each of the radix-2 ACS units 74 and 76 has a third input (not shown) coupled to the channel output via the line 20, and the channel output is used to compute the branch metric for the radix-2 ACS units 74 and 76.

The selection unit 72 has three multiplexers 92a, 92b and 92c. An input 1 of the multiplexer 92a and an input 2 of the multiplexer 92b are coupled to the second output from the radix-2 ACS unit 76 via the line 86. An input 1 of the multiplexer 92b and an input 2 of the multiplexer 92c are coupled to the output of the path metric register 80d via a line 93. An input 2 of the multiplexer 92a and an input 1 of the multiplexer 92c are coupled to the output of the path metric register 80e via a line 94. An output from the multiplexer 92a is inputted via a line 95 to the path metric register 80d. An output from the multiplexer 92b is inputted via a line 96 to the path metric register 80e. An output from a sign unit 97 is inputted via a line 98 to control inputs, input 3, of the multiplexers 92a, 92b, 92c. The input of the sign unit 97 is coupled to the channel output $y_k$ on the line 20. An output of the sign unit 97 is the sign bit of $y_k$. More specifically, the output of the sign unit 97 is +1 if the input of the sign unit 97 is greater than 0, whereas the output of the sign unit 97 is −1 if the input of the sign unit 97 is less than 0.

Figure 8:
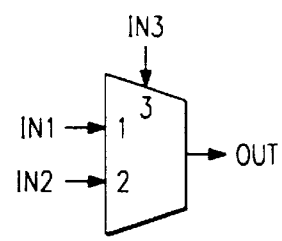
FIG. 8 is a schematic block diagram of a multiplexer unit used in the RSVD of FIG. 7.

FIG. 8 shows the relationship between the output and inputs of the multiplexer units 92a, 92b, and 92c. When the control input, input 3, is a positive one (+1) then the output of the multiplexer is the value at input 1. On the other hand, if the control input, input 3, is a negative one (−1) then the output of the multiplexer unit is the value at input 2.

Figure 9:
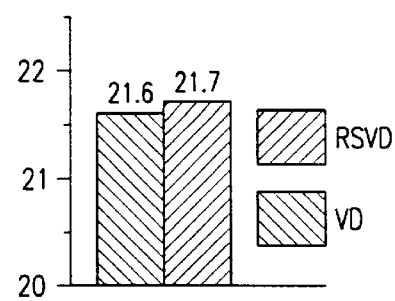
FIG. 9 is a graph showing simulation results which compare the required channel SNR for the RSVD in FIG. 7 with that of the conventional Viterbi detector.

FIG. 9 and FIG. 10 show the results of computer simulations used to evaluate the performance of detector 70, FIG. 7. The simulated system is a magnetic recording system with the channel modeled as a Lorentzian channel in additive white Gaussian noise (AWGN), with channel density 2.5. The discrete channel 18 is obtained by equalizing the Lorentzian channel to the EPR4 channel. A rate 8/9 RLL code is used for the channel encoder 14, but it has no impact on the trellis 50, FIG. 4, and therefore, no impact on the detector 70. The performance is evaluated as the required channel signal-to-noise ratio (SNR) for achieving an error rate of $10^{-5}$ and the results are shown in FIG. 9. The required channel SNR for the detector 70, FIG. 7, is 21.7 dB while the required channel SNR for a conventional Viterbi detector is 21.6 dB, which is a negligible performance loss.

FIG. 10 is a table comparing the histogram of error events for the detector 70, FIG. 7, and the conventional Viterbi detector, at error rates of $10^{-5}$ and $10^{-4}$. The numbers in row 400 indicate the length of the error event, and numbers in rows 402, 404, 406, 408 indicate the number of times that the error event, with the length being indicated by the number in row 400, was detected for the corresponding detectors indicated in column 410. The comparison shows that the CSGT causes negligible error propagation even though a feedback mechanism is used in the present invention, as in other reduced-state techniques.

The present invention has several advantages. For example, only two radix-2 ACS units are needed for decoding the EPR4 channel compared to 4 radix-2 ACS units required by the conventional Viterbi detector. The performance loss is negligible. There is no extra error propagation with the present invention for the EPR4 channel, which is unachievable with the classical RSSE.

Although illustrative embodiments of the invention have been shown and described, a wide range of modification, change, and substitution is contemplated in the foregoing disclosure and in some instance, some features of the present invention may be employed without a corresponding use of the other feature. Accordingly, it is appropriate that the appended claims be construed broadly and in a manner consistent with the scope of the embodiments disclosed herein.

What is claimed is:

1. A system for data transfer between a user and a receiver comprising:
    a channel encoder for encoding a data string to produce an encoded data string;
    a discrete time channel coupled to the channel encoder for transferring the encoded data string;
    a reduced-state detector coupled to the discrete time channel, wherein the reduced-state detector utilizes a complement states grouping technique to reduce the number of states in the detector and decodes an output of the discrete time channel to generate the encoded data string; and
    a channel decoder coupled to the reduced-state detector for recovering the data string from the encoded data string.

2. The system of claim 1 wherein the reduced-state detector comprises:
    at least two ACS units; and
    a selection unit coupled to one of the at least two ACS units.

3. The system of claim 1, wherein the discrete time channel comprises:
    a digital modulator coupled to the channel encoder for modulating the encoded data to produce a modulated signal;
    a noisy channel medium coupled to the digital modulator for transferring the modulated signal; and
    a demodulator coupled to the noisy channel medium for demodulating the modulated signal to produce the encoded data string.

4. The system of claim 1 wherein the discrete time channel is an EPR4 channel.

5. The system of claim 1 wherein the discrete time channel is an extended EPR4 channel.

6. The system of claim 1 wherein the discrete time channel is a generalized partial response channel with integer coefficients.

7. The system of claim 1 wherein the discrete time channel is a generalized partial response channel with non-integer coefficients.

8. The method of claim 1 wherein the discrete time channel is a channel with binary inputs.

9. The method of claim 1 wherein the discrete time channel is a channel with multilevel channel inputs.

10. A magnetic storage system comprising:
    a channel encoder for encoding a data string to produce an encoded data string,
    a magnetic storage disk for recording said encoded data string,
    a reduced-state detector for decoding a data string read from said magnetic storage disk;
    a channel decoder for recovering the data string outputted from said reduced-state detector,
        wherein said reduced-state detector utilizes a complement states grouping technique to reduce the number of states in the detector and groups a pair of complement states to form a superstate if the pair of complement states have a state distance satisfying a predetermined criterion.

11. A magnetic storage system according to claim 10 wherein:
    the state distance between a first state of the pair of complement states and a second state of the pair of complement states is a minimum distance between two paths which originate from an origination state and terminate at the first state and the second state, respectively.

12. A magnetic storage system according to claim 10 wherein:
    the reduced-state detector comprising
        at least two ACS units
        and a selection unit coupled to one of at least two ACS units.

13. A magnetic storage system according to claim 12 wherein:
    each ACS unit selects a branch value for each one of a plurality of multi-valued branches by using feedback from a survivor path of a superstate.

* * * * *